United States Patent [19]

Schmitt

[11] Patent Number: 4,645,925
[45] Date of Patent: Feb. 24, 1987

[54] REFERENCE MARK CODING SYSTEM

[75] Inventor: Walter Schmitt, Traunreut, Fed. Rep. of Germany

[73] Assignee: Dr. Johannes Heidenhain GmbH, Traunreut, Fed. Rep. of Germany

[21] Appl. No.: 584,829

[22] Filed: Feb. 29, 1984

[30] Foreign Application Priority Data

Mar. 12, 1983 [DE] Fed. Rep. of Germany ....... 3308813

[51] Int. Cl.$^4$ .............................................. H01J 3/14
[52] U.S. Cl. ................................ 250/237 G; 33/125 C
[58] Field of Search ........ 250/231 R, 231 SE, 237 G; 356/395; 340/347 P; 364/560, 561, 562; 33/125 C

[56] References Cited

U.S. PATENT DOCUMENTS

| | | | |
|---|---|---|---|
| 4,158,509 | 6/1979 | Rieder et al. | 356/395 |
| 4,384,204 | 5/1983 | Tamaki et al. | 250/237 G |
| 4,403,859 | 9/1983 | Ernst | 250/237 G |
| 4,477,189 | 10/1984 | Ernst | 33/125 C |
| 4,491,928 | 1/1985 | Reichl | 250/237 G |

Primary Examiner—David C. Nelms
Attorney, Agent, or Firm—Willian Brinks Olds Hofer Gilson & Lione Ltd.

[57] ABSTRACT

A measuring system includes reference marks provided in the measuring direction alongside the graduation of the scale. These reference marks are absolutely allocated to the graduation and are used to generate reproduceable control pulses. For the identification of each reference mark there is serially allocated to each reference mark a code mark which is made up of code mark segments. The code mark segments follow one upon the other without gaps in the measuring direction, and each includes a homogeneously continuous surface or zone. These code mark segments are arranged in correspondence to their coded information, offset parallel to one another transversely to the measuring direction and are scanned by a scanning field which is integrated in the scanning field used to scan the reference marks. This gapless arrangement of the code mark segments prevents interference with the scanning of the reference marks.

10 Claims, 8 Drawing Figures

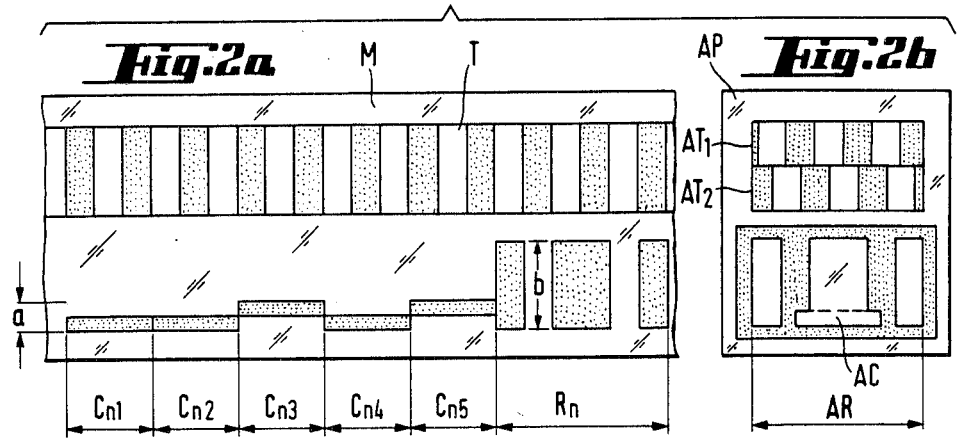
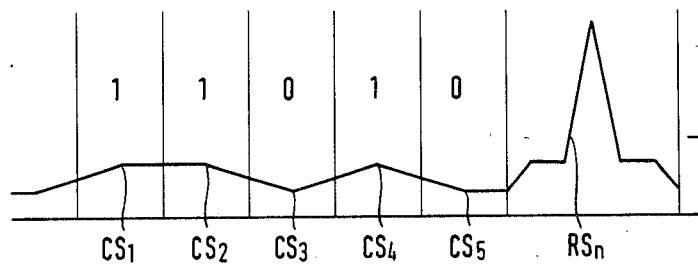
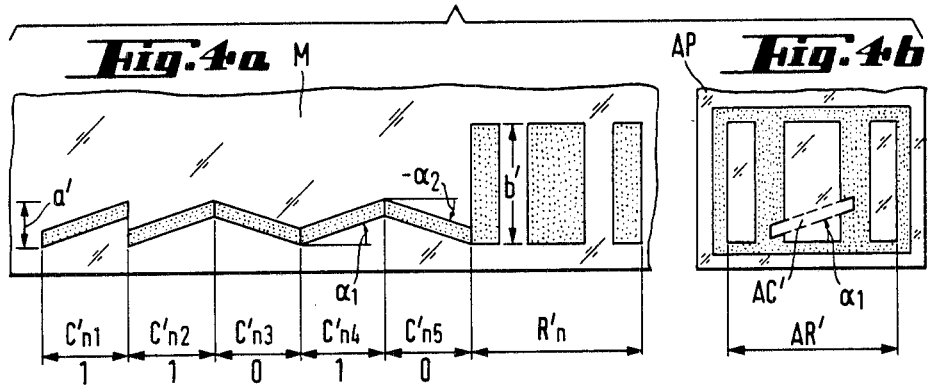

REFERENCE MARK CODING SYSTEM

BACKGROUND OF THE INVENTION

The present invention relates to a coding system for identifying reference marks in a measuring instrument of the type which includes a measuring scale that defines a graduation and a plurality of identical reference marks positioned alongside the graduation, a scanning unit comprising means for scanning both the graduation and the reference marks, and means for utilizing control pulses generated from the reference marks.

In such a measuring system the electrical control pulses generated in response to the reference marks can be used in a variety of ways. For example, such control pulses can be used to set a counter included in the measuring system to the value zero, to load a predetermined measurement value into the counter at the beginning of a measuring operation, or to control interference pulses. In addition, such control pulses can be used to control a control arrangement engaged on the outlet side of the measuring system.

German Patent DE-PS No. 24 16 212 discloses a prior art incremental length or angle measuring system which includes an incremental graduation and a series of reference marks provided on a separate track alongside the graduation. The absolute values of these reference marks are determined from the differing spacings between individual ones of the reference marks. The spacings between the reference marks are determined by scanning the incremental graduation. With this system in order to determine the absolute position of any single reference mark, at least two reference marks must be scanned. This process is relatively complicated and time consuming if for example two such reference marks lie far apart. Moreover, in the event the increments between two reference marks are counted erroneously, an erroneous spacing can be measured and thereby erroneous absolute values can be assigned to reference marks.

German Patent DE-PS No. 29 52 106 describes an incremental length or angle measuring system in which a plurality of reference marks are provided on a scale alongside the measuring graduation. In the disclosed system each of the reference marks is provided with a unique line group distribution, different from that of the other reference marks. The individual reference marks are scanned by separate scanning fields included in the scanning unit, each scanning field being clearly allocated to a selected one of the reference marks having a corresponding line distribution. This approach is relatively expensive to implement, since the line group distributions of the individual reference marks should differ as much as possible one to another in order to permit an unambiguous identification of the individual reference marks. The scanning unit must include a separate corresponding scanning field for each of the reference marks to be identified.

German DE-OS No. 30 39 483 discloses an incremental length or angle measuring system in which a reference mark track and a code track are arranged parallel to one another alongside a graduation track. In this system separate scanning fields in the scanning unit are required for the scanning of the reference marks and the associated code marks. Each portion of the code mark is allocated a respective scanning field on the scanning plate.

SUMMARY OF THE INVENTION

The present invention is directed to a system for identifying individual reference marks, which is particularly simple and inexpensive to implement.

According to this invention, a plurality of code marks are provided, each associated with a respective one of the reference marks and positioned between a pair of adjacent reference marks. Each code mark comprises at least one code mark segment and each code mark segment defines a respective surface zone which is homogenously continuous in the measuring direction. The code mark segments of each code mark are positioned adjacent to one another, without gaps therebetween in the measuring direction, and individual ones of the code mark segments are offset with respect to one another transversely to the measuring direction in accordance with the information encoded in the code mark segments.

The present invention provides important advantages in terms of simplicity. The number of scanning fields in the scanning plate of the scanning unit can be considerably reduced by the arrangement of code mark segments described above. This is because the scanning field for the code mark segments can be integrated with the scanning field for the reference marks. To this common scanning field there is allocated only one scanning element. This arrangement of the code mark segments yields during scanning of the reference marks only one direct voltage constituent in the generated scanning signal. For this reason the reference marks are recognized in a sure and certain manner and the coded information in the code marks is read out in a clear and unambiguous manner. Further advantageous features of the invention are set forth in the dependent claims.

The invention itself, together with further objects and attendant advantages, will best be understood by reference to the following detailed description, taken in conjunction with the accompanying drawings.

BRIEF DESCRIPTION OF THE DRAWINGS

FIG. 2 includes FIGS. 2a and 2b and is a plan view showing a portion of the measuring scale FIG. 2a and the scanning plate FIG. 2b of the embodiment of FIG. 1.

FIG. 3 is a signal diagram showing scanning signals generated in response to the code mark segments and reference marks of FIG. 2.

FIG. 4 includes FIGS. 4a and FIG. 4b and is a plan view of a portion of a measuring scale FIG. 4a and a scanning plate FIG. 4b from a second preferred embodiment of this invention.

DETAILED DESCRIPTION OF THE PRESENTLY PREFERRED EMBODIMENTS

Figure 1:
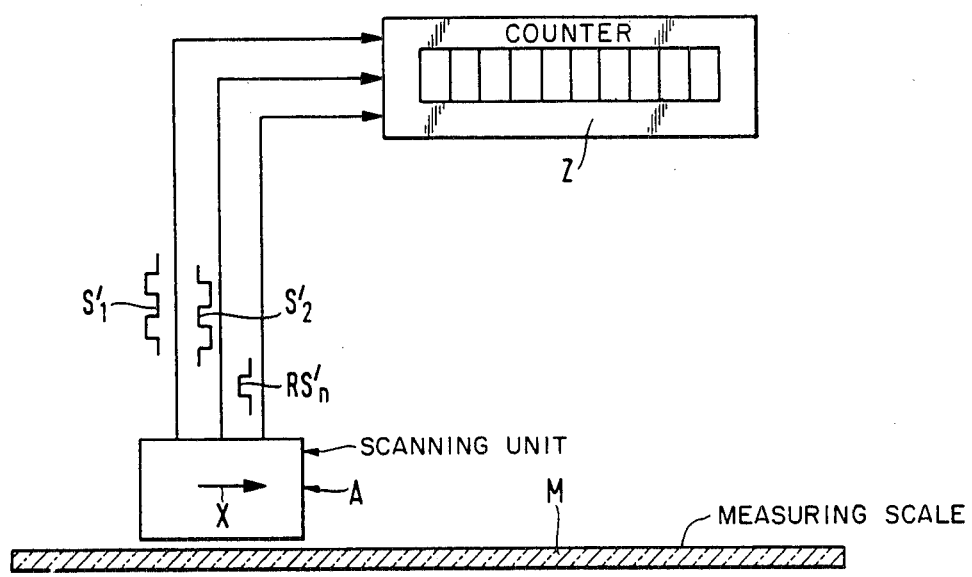
FIG. 1 is a schematic representation of an incremental length measuring system which incorporates a first preferred embodiment of this invention.

Turning now to the drawings, FIG. 1 is a schematic representation of a photoelectric, incremental length measuring system that includes a measuring scale M and a scanning unit A. Both the scale M and the scanning unit A are connected in a manner not shown with respective objects to be measured, such is the bed and slide piece of a processing machine. On the scale M there is applied an incremental graduation T in a form of a line grid (FIG. 2) which is scanned in direct light, photoelectrically without contact by the scanning unit A. Alongside the graduation T there is provided on the scale M a series of reference marks $R_n$ ($n=1, 2, 3, \ldots$). Each of the reference marks $R_n$ consists of an identical line group with a predetermined line distribution such that each of the reference marks $R_n$ is identical to the others. The scanning unit A operates to generate periodic scanning signals $S_1$, $S_2$ in response to the graduation T. These periodic scanning signals $S_1$, $S_2$ are amplified in the scanning unit A and converted into square wave signals $S'_1$, $S'_2$. The square wave signals $S'_2$, $S'_2$ are applied to an electronic counter Z which displays the measured position values in digital form. The square wave signals $S'_1$, $S'_2$ are phase-shifted with respect to one another by a quarter of the grid constant (division period) of the graduation T in order to allow the scanning direction to be determined. The scanning unit A generates reference signals $RS_n$ in response to the reference marks $R_n$. These reference signals $RS_n$ are amplified in the scanning unit A, transformed into square wave signals $RS'_n$ and likewise applied as inputs to the counter Z.

The reference signals $RS_n$ obtained from the reference marks $R_n$ can be used to trigger various functions. For example, if a particular reference signal $RS_n$ is used to load a predetermined absolute position value into the counter Z, an incremental measuring system can be provided with some of the advantages of an absolute measuring system. In this arrangement it is often preferable to allocate a number to each reference mark $R_n$ which represents the absolute position of the reference mark $R_n$ with respect to an invariable zero point. Alternatively, a certain reference mark $R_n$ can be used to set the counter Z to the value "zero" when the associated reference signal $RS_n$ obtained from that reference mark $R_n$ is generated. Such functions are only feasible however if the selected reference mark $R_n$ can be clearly identified from among the series of reference marks.

According to this invention for the identification of each of the identical reference marks $R_n$ a plurality of code marks $C_n$ are provided which are arranged in alternating series with the reference marks $R_n$. Each of the code marks $C_n$ is made up of at least one code mark segment $C_{nm}$, ($n, m = 1, 2, 3, \ldots$). As shown in FIG. 2a, the code mark segments $C_{nm}$ each define a homogeneously continuous zone along the measuring direction X, and the adjacent ones of the code mark segments $C_{nm}$ follow one upon the other in the measuring direction X without gaps therebetween. As shown in FIG. 2a, the code mark segments $C_{nm}$ are arranged between individual ones of the reference marks $R_n$ on the scale M, and the code mark segments $C_{nm}$ take the form of lines running parallel to the measuring direction X. Individual ones of the code mark segments $C_{nm}$ are offset parallel to one another, transversely to the measuring direction X, in accordance with the information encoded in the code mark segments $C_{nm}$. FIG. 2a shows only one reference mark $R_n$ of the series of reference marks $R_n$ and only the code mark segments $C_{n1}$–$C_{n5}$ associated with that reference mark $R_n$. As shown in FIG. 2a, reference mark $R_n$ is made up of a line group having three lines running transversely to the measuring direction X with a predetermined line distribution that is identical to that of all the reference marks $R_n$.

The scanning unit A includes a scanning plate AP as shown in FIG. 2b for the scanning of the scale M. The scanning plate AP includes two scanning fields $AT_1$, $AT_2$ for the scanning of the graduation T. These two scanning fields $AT_1$, $AT_2$ are offset with respect to one another by a quarter of the grid constant of the graduation T. The scanning fields $AT_1$, $AT_2$ are identical with the graduation T. Photosensors (not shown) are aligned with each of the scanning fields $AT_1$, $AT_2$ for the generation of the scanning signals $S_1$, $S_2$. In addition, the scanning plate AP defines a scanning field $A_R$ for the scanning of the reference marks $R_n$. A photosensor (not shown) is aligned with the scanning field $A_R$ for the generation of the reference signal $RS_n$. For the scanning of the lower series of code mark segments $C_{n1}$, $C_{n2}$, $C_{n4}$ there is provided on the scanning plate AP a scanning field $A_C$ which is integrated in the scanning field $A_R$. The same photosensor which generates the reference signal $RS_n$ serves likewise to generate the code signals $CS_{n1}$–$CS_{n5}$. No scanning field is aligned with the upper series of code mark segments $C_{n3}$, $C_{n5}$. The scanning field $A_R$ agrees with and corresponds in shape to the reference mark $R_n$, and the scanning field $A_C$ agrees with and corresponds in shape to the code mark segments $C_{nm}$.

The code signals $CS_{n1}$–$CS_{n5}$ generated in the scanning of the scale M in a positive measuring direction X from left to right by the scanning field $A_C$ yields the binary combination "11010" for the clear identification of the associated reference mark $R_n$ (FIG. 3). The code mark segments $C_{n1}$–$C_{n5}$ are also scanned by the scanning field $A_R$ for the reference marks $R_n$. Since the code mark segments $C_{n1}$–$C_{n5}$ are offset parallel to one another in correspondence to their encoded information, without any gap therebetween in the measuring direction X, and since the total width a of the parallel displaced code mark segments $C_{n1}$–$C_{n5}$ is only a fraction of the width b of the reference mark $R_n$ perpendicularly to the measuring direction X, the scanning of the code mark segments $C_{n1}$–$C_{n5}$ by the scanning field $A_R$ and the associated photosensor generates only a direct voltage signal which does not impair the exact determination of the reference signal $RS_n$. The code signals $CS_{n1}$–$CS_{n5}$ are applied as input signals to the evaluating arrangement in the counter Z.

When the scanning A scans the scale M in a positive measuring direction X from left to right, the next code mark segment $C_{n+1, l}$ immediately follows the reference mark $R_n$, and the associated reference mark $R_{n+1}$ follows the next code mark segment $C_{n+1, m}$. For clarity, the next code mark segments $C_{n+1, m}$ and the next reference mark $R_{n+1}$ are not shown in FIG. 2. In order for the scanning unit to be able to detect the first code mark segment $C_{n+1, l}$, the code mark segment $C_{n+1, l}$ should have for example the binary value 1. Quite generally, the code mark segments $C_{nm}$ can include beginning of code mark and end of code mark information. When the beginning of code mark information is read, the evaluating arrangement of the counter Z can be prepared to read out code information data immediately after the beginning of code mark information. The end of code mark information serves to assure that the entire code information has been read out. In this way, any possible reversal of the measuring direction X in the middle of the scanning of a code mark can be recognized.

In the movement of the scanning unit A in a positive measuring direction X from left to right the code information of the code mark segments $C_{nm}$ is scanned before the scanning of the associated reference mark $R_n$. When the scanning unit A is moved to scan in a negative direction −X from right to left it is recognized through the direction-dependent evaluation of the code information data that after the code mark segments $C_{n+1, m}$ there must follow the reference mark $R_n$.

Preferably, the code mark segments $C_{nm}$ and the reference marks $R_n$ in the measuring direction X are formed as a whole number part or a whole number multiple of the incremental graduation (division) T on the scale M. When this is done the scanning of the code mark segments $C_{nm}$ and of the reference marks $R_n$ occurs in the rhythm of the scanning of the incremental graduation T.

FIG. 4a shows a portion of a second preferred embodiment of this invention and in particular a portion of a scale M and an associated scanning plate AP. As shown in FIG. 4, reference marks $R'_n$ as well as the associated code mark segments $C'_{n1}$–$C'_{n5}$ are positioned on the scale M in a manner somewhat similar to that described above. In this embodiment however the code mark segments $C'_{nm}$ enclose, depending upon their encoded information, an angle of $+\alpha_1$ or an angle of $-\alpha_2$ with respect to the positive measuring direction X. The angle $+\alpha_1$ is greater than 0° and less than 90°, and $-\alpha_2$ is less than 0° and greater than $-90°$. Thus, $+\alpha_1$ is between 0° and 90° and $-\alpha_2$ is between 0° and $-90°$. For example, code mark segments oriented at the angle $\alpha_1$ can be assigned to the binary state "1" and code mark segments oriented at the angle $-\alpha_2$ can be assigned to the binary state "0". A scanning field as shown in FIG. 4b, $A'_C$ is provided on the scanning plate AP for scanning the code mark segments $C'_{n1}$–$C'_{n5}$. The scanning field $A'_C$ encloses the angle $+\alpha_1$ with the positive measuring direction X. Code mark segments $C'_{n1}$, $C'_{n2}$, $C'_{n4}$ aligned with the scanning field $A'_C$ result in a binary signal "1" and code mark segments $C'_{n3}$, $C'_{n5}$ oriented at the angle $-\alpha_2$ result in a code signal "0". The scanning of the code mark segments $C'_{n1}$–$C'_{n5}$ therefore yields the binary number "11010" in order to identify clearly and unambiguously the associated reference mark $R'_n$. The code mark segments $C'_{n1}$–$C'_{n5}$ are scanned by the scanning field $A'_R$ for the reference mark $R'_n$. Since the code mark segments $C'_{n1}$–$C'_{n5}$ in correspondence with their code information are arranged at an angle $+\alpha_1$, $-\alpha_2$, without gaps in the measuring direction X, and since the width a' of the code mark segments $C'_{n1}$–$C'_{n5}$ amounts only to a portion of the width b' of the reference mark $R'_n$ perpendicular to the measuring direction X, the scanning of the code mark segments $C'_{n1}$–$C'_{n5}$ by the scanning field $A'_R$ results in the generation of only a direct voltage signal in the reference signal which does not impair the exact determination of the reference signal $RS'_n$. The scanning field $A'_R$ agrees with and is positioned to come into alignment with the reference mark $R'_n$ and the scanning field $A'_C$ integrated in the scanning field $A'_R$ agrees with and is positioned to come into alignment with the code mark segments $C'_{nm}$ which are oriented at the angle $+\alpha_1$, indicative of the binary code information "1".

The generated code signals $CS_{nm}$, $CS'_{nm}$ are evaluated in the evaluating arrangement of the counter Z. This evaluating arrangement can contain a selection device with the aid of which certain reference marks $R_n$, $R'_n$ can be selected from the series of reference marks $R_n$, $R'_n$ and brought into operation.

Of course, it should be understood that a wide range of changes and modifications can be made to the preferred embodiments described above. It is therefore intended that the foregoing detailed description be regarded as illustrative rather than limiting, and that it be understood that it is the following claims, including all equivalents, which are intended to define the scope of this invention.

I claim:

1. In a measuring instrument of the type comprising a measuring scale which defines a graduation which extends along a measuring direction and a plurality of identical reference marks positioned alongside the graduation; a scanning unit comprising means for scanning the graduation and means for generating reference signals in response to the reference marks; and means for utilizing the reference signals; the improvement comprising:

a plurality of code marks, each associated with a respective one of the reference marks and positioned between a pair of adjacent reference marks, each code mark comprising at least one code mark segment, each code mark segment defining a surface zone which is homogeneously continuous in the measuring direction, the code mark segments of each code mark positioned adjacent to one another, without gaps therebetween in the measuring direction, sand individual ones of the code mark segments being positioned relative to one another in the direction transverse to the measuring direction in accordance with information encoded by the code mark segments.

2. The invention of claim 1 wherein the scanning unit comprises a reference mark scanning field and a photosensor aligned with the reference mark scanning field to generate the reference signals in response to the reference marks, and wherein the invention further comprises a code mark segment scanning field integrated with the reference mark scanning field such that the Photosensor which scans the reference marks also scans the code mark segments.

3. The invention of claim 1 wherein all of the code mark segments are aligned parallel to one another and are offset to one another transversely to the measuring direction in accordance with their coded information.

4. The invention of claim 1 wherein the code mark segments are arranged in accordance with their coded information at angles of $+\alpha_1$ and $-\alpha_2$ with respect to the measuring direction.

5. The invention of claim 1 wherein each of the code marks encodes identification information for the associated reference mark as well as completeness information for indicating completeness of the code mark.

6. The invention of claim 1 wherein the graduation defines a graduation period and wherein both the code mark segments and the reference marks are formed as a whole number fraction of the graduation period.

7. The invention of claim 4 wherein $+\alpha_1$ and $-\alpha_2$ are within the following ranges:
$0° < +\alpha_1 < 90°$; and
$0° > -\alpha_2 > -90°$.

8. The invention of claim 1 wherein the graduation defines a graduation period and wherein both the code mark segments and the reference marks are formed as a whole number multiple of the graduation period.

9. In a measuring instrument of the type comprising a measuring scale which defines a graduation which extends along a measuring direction and a plurality of identical reference marks positioned alongside the graduation; a scanning unit comprising means for scanning the graduation and means for generating reference signals in response to the reference marks; and means for utilizing the reference signals; the improvement comprising:

a plurality of code marks, each associated with a respective one of the reference marks and positioned between a pair of adjacent reference marks, each code mark comprising a plurality of code mark segment regions, each code mark segment region defining a parallel first and secondary boundary, the code mark segment regions of each code mark aligned in the measuring direction such that at least one of the boundaries of each code mark segment region is shared by one of the boundaries of an adjacent code mark segment region;

a plurality of code mark segments, each segment associated with a respective one of the code mark segment regions, each code mark segment extending from the first boundary to the second boundary of the respective code mark segment region, each code mark segment oriented within the code mark segment region in accordance with information encoded by the code mark segments.

10. The invention of claim 9 wherein each of the code marks encodes identification information for the associated reference mark as well as completeness information for indicating completeness of the code mark.

* * * * *

UNITED STATES PATENT AND TRADEMARK OFFICE
CERTIFICATE OF CORRECTION

PATENT NO. : 4,645,925
DATED : Feb. 24, 1987
INVENTOR(S) : Walter Schmitt

It is certified that error appears in the above-identified patent and that said Letters Patent is hereby corrected as shown below:

In column 2, line 44, please delete "invention;" and substitute therefor --invention.--;

In column 2, line 52, please delete "and FIG. 4b" and substitute therefor --and 4b--

In column 2, line 64, please delete "such is" and substitute therefor --such as--;

In column 3, line 10, please delete "$S'_2, S'_2$" and substitute therefor --$S'_1, S'_2$--;

In column 5, line 27, please delete ""0"." and substitute therefor --"0", as shown in FIG. 4b.--

UNITED STATES PATENT AND TRADEMARK OFFICE
CERTIFICATE OF CORRECTION

PATENT NO. : 4,645,925

DATED : Feb. 24, 1987

INVENTOR(S) : Walter Schmitt

It is certified that error appears in the above-identified patent and that said Letters Patent is hereby corrected as shown below:

In claim 1 (column 6, line 23), please delete the word "sand" and substitute therefor the word --and--.

Signed and Sealed this

Third Day of May, 1988

Attest:

DONALD J. QUIGG

Attesting Officer

Commissioner of Patents and Trademarks